United States Patent [19]

Masuda et al.

[11] 4,278,943

[45] Jul. 14, 1981

[54] INTEGRATION CIRCUIT

[75] Inventors: Eiji Masuda; Chikara Sato, both of Kawasaki; Yasoji Suzuki, Ayase, all of Japan

[73] Assignee: Tokyo Shibaura Denki Kabushiki Kaisha, Japan

[21] Appl. No.: 920,343

[22] Filed: Jun. 29, 1978

[30] Foreign Application Priority Data

Jun. 29, 1977 [JP] Japan ................................ 52-76622

[51] Int. Cl.[3] ........................ H03K 5/00; G06G 7/186

[52] U.S. Cl. .................................... 328/127; 307/241; 307/240; 307/494

[58] Field of Search ............... 307/229, 230, 240, 241, 307/247 A; 328/127, 150, 151

[56] References Cited

U.S. PATENT DOCUMENTS

| | | | |
|---|---|---|---|
| 3,064,144 | 11/1962 | Hardy | 328/127 X |
| 3,469,197 | 9/1969 | Ryan | 328/150 |
| 3,586,989 | 6/1971 | Wheable | 307/241 X |
| 3,603,814 | 9/1971 | Ohashi | 307/240 |
| 3,723,907 | 3/1973 | Tajchman et al. | 328/127 X |
| 3,875,428 | 4/1975 | Le Blanc et al. | 307/229 |

FOREIGN PATENT DOCUMENTS

| | | |
|---|---|---|
| 47-11066 | 6/1972 | Japan . |
| 51-20147 | 6/1976 | Japan . |
| 51-26218 | 8/1976 | Japan . |
| 51-41543 | 11/1976 | Japan . |

OTHER PUBLICATIONS

IBM Tech. Bulletin, vol. 5, No. 8, Jan. 1963, pp. 51, 52, "Analog to Digital Converter", by Propster.

*Primary Examiner*—John S. Heyman

*Attorney, Agent, or Firm*—Finnegan, Henderson, Farabow, Garrett & Dunner

[57] ABSTRACT

An integration circuit comprises an operational amplifier with first and second input terminals and an output terminal, an integration capacitor connected between the first input terminal and the output terminal, an integration resistor connected at one end to the first input terminal, a switch connected at one end to the other end of said resistor, a voltage signal source to be integrated which is connected through the switch to the other end of the resistor, and a reference voltage signal source connected to the second input terminal. The integration circuit further comprises means which applies, at the same time as the switch is opened, a signal with the same potential as the signal derived from the reference voltage signal source to said other end of the resistor, thereby to prevent an output signal from being adversely affected by a parasitic capacitance of the switch.

An integration method includes a first step for applying a voltage signal to be integrated to an input part of an integration circuit and a second step for stopping the application of the integration voltage signal to the input part, and further comprises a third step for applying a reference potential signal to the input part of the integration circuit at the same time as the voltage signal to be integrated stops.

16 Claims, 8 Drawing Figures

FIG. 1
PRIOR ART
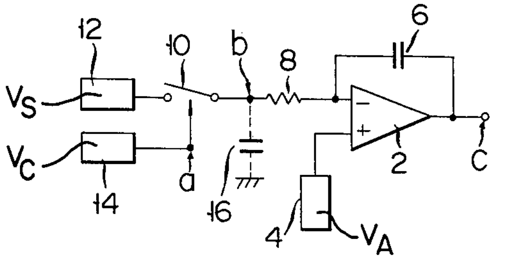
FIG. 2A
FIG. 2B
FIG. 2C
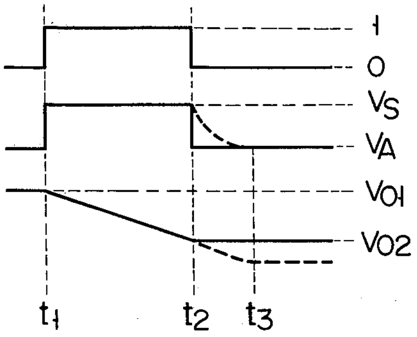
FIG. 3
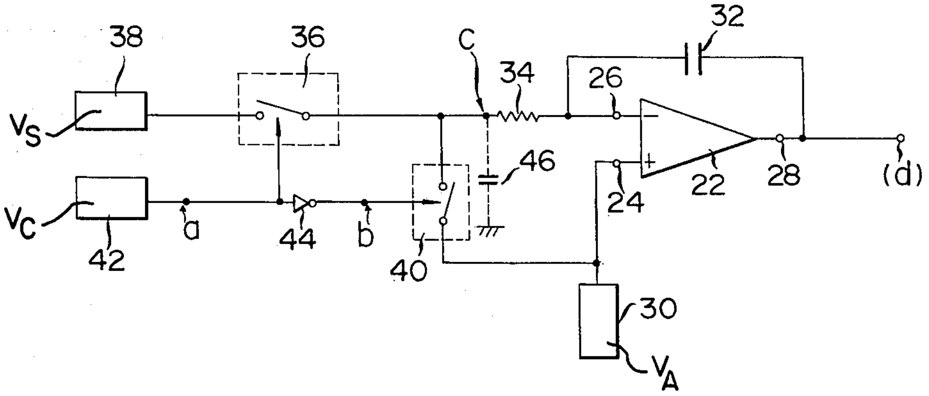

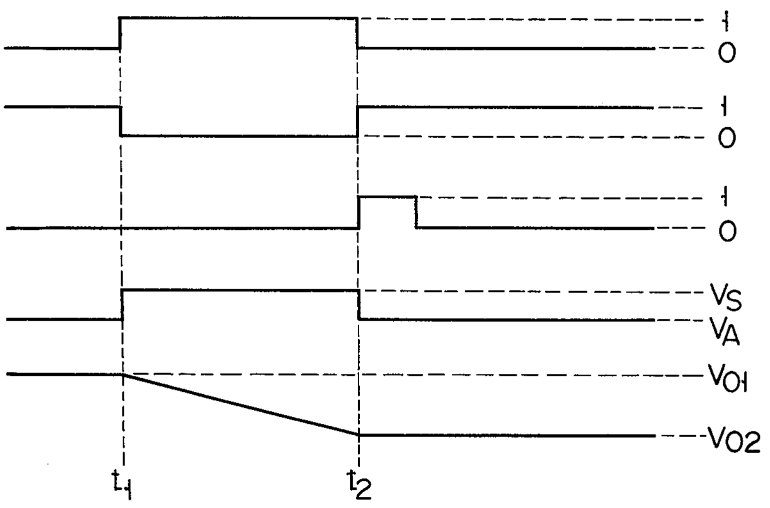
FIG. 4A
FIG. 4B
FIG. 4B'
FIG. 4C
FIG. 4D
FIG. 5
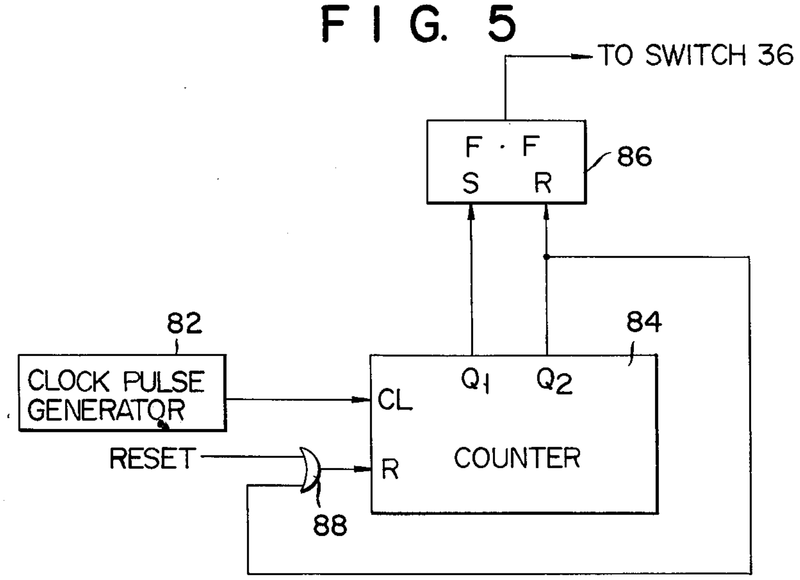
FIG. 6
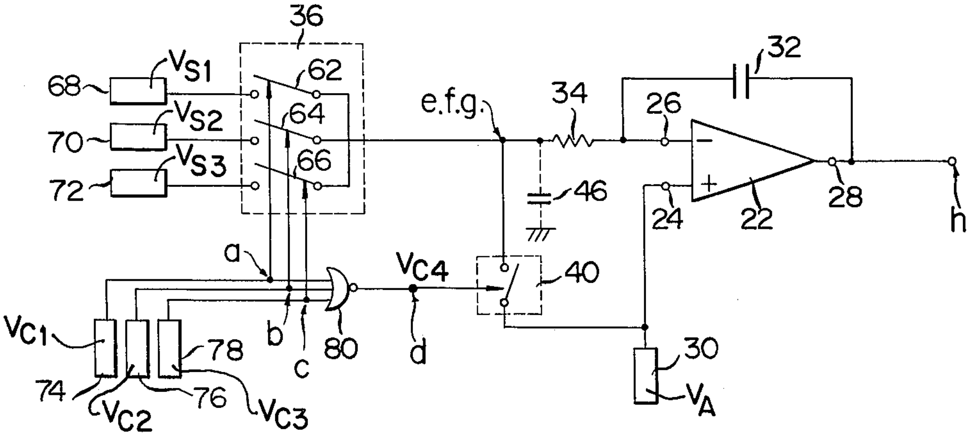

FIG. 7A
FIG. 7B
FIG. 7C
FIG. 7D
FIG. 7E
FIG. 7F
FIG. 7G
FIG. 7H
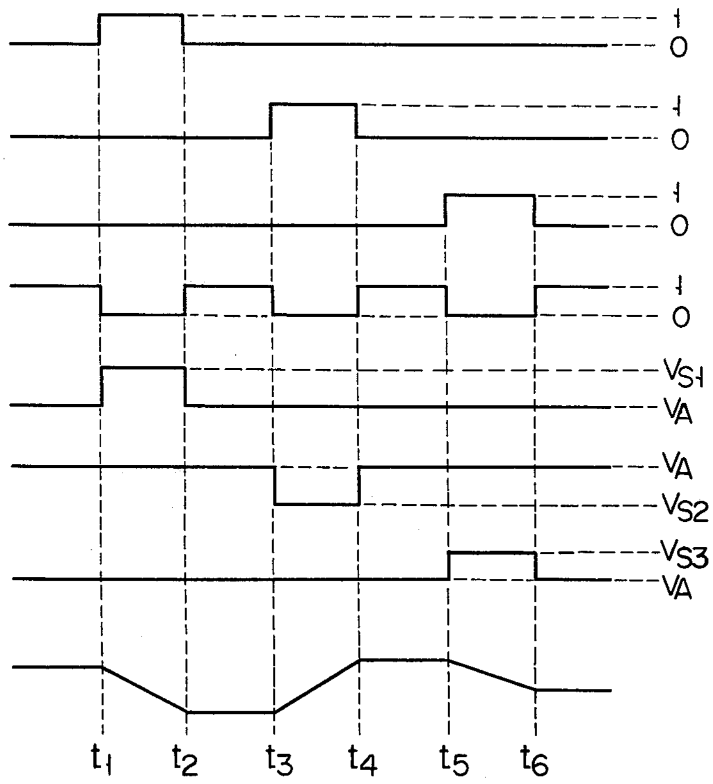
FIG. 8
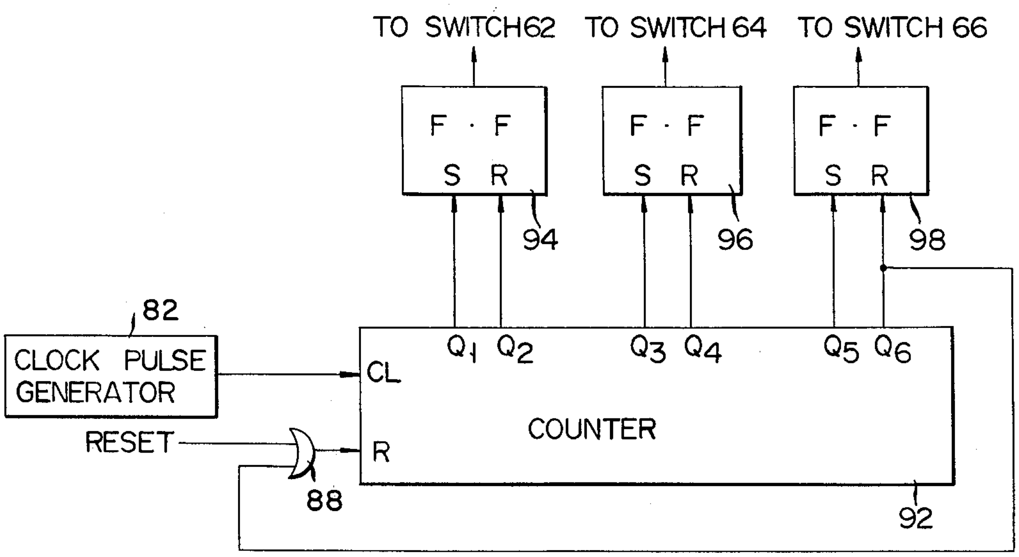

INTEGRATION CIRCUIT

BACKGROUND OF THE INVENTION

The invention relates to an integration circuit and an integration method and, more particularly, to an improvement thereto in that an integrated output signal is sustained at a correct value.

An integration circuit, which integrates an input signal to produce an integrated signal, is well-known and used as an analogue to digital converter, for example. One such integration circuits is shown in FIG. 1. In the figure, an operational amplifier designated by reference numeral 2 has two input terminals, i.e. inverting and non-inverting, terminals and an output terminal. The non-inverting terminal is connected to a reference voltage source 4 supplying a voltage $V_A$, for example, the ground potential. An integration capacitor 6 with a capacitance C is inserted between the inverting terminal and the output terminal of the operational amplifier 2. The inverting terminal is further connected to one end of an integration resistor 8 with a resistance R. The resistor 8 is connected at the other end to a voltage source 12 for supplying a voltage Vs to be integrated, through a switch 10. The open and close operations of the switch 10 are controlled by a control signal supplied from a control voltage signal source (Vc) 14. FIGS. 2A to 2C illustrate waveforms of signals at points a, b and c in the circuit in FIG. 1, respectively. The switch 10 is closed when the control voltage signal Vc is at high level (during the period from $t_1$ to $t_2$), for example. The voltage signal Vs is continuously applied to the other end of the resistor 8 so long as the switch 10 is closed. The potential at the inverting terminal of the amplifier 2 when the switch 10 is open is equal to that at the non-inverting terminal.

FIG. 2B shows a signal waveform illustrating a potential change at said other end of the resistor 8, i.e. the terminal at the voltage source 12 side. When the voltage signal Vs to be integrated is applied to said other end of the resistor 8 during the period from $t_1$ to $t_2$, as shown in FIG. 2B, an integrated output signal having a value $V_{02}$ appears at time $t_2$ at the output terminal of the amplifier 2, as shown in FIG. 2C. The signal $V_{02}$ is given $$V_{02} = V_{01} - 1/C \int_{t_1}^{t_2} (Vs - V_A)/R \, dt$$

where $V_{01}$ is the potential at the output terminal of the amplifier 2, at time $t_1$. When the switch 10 is opened at time $t_2$, the potential at said other end of the resistor 8 instantaneously returns to the reference potential $V_A$, as indicated by a solid line in FIG. 2B. Therefore, the potential at the output terminal, i.e. the point c, must be fixed at the integrated value $V_{02}$ after time $t_2$, as indicated by a solid line in FIG. 2C.

However, the potential at said other end of the resistor 8, in fact, does not sharply reduce to the reference potential $V_A$ at time $t_2$ but starts at time $t_2$ to exponentially decrease and to be equal to the reference potential $V_A$ at time $t_3$. Thus, the potential of the signal at the output terminal, or the point c, of the amplifier 2 continues its change after time $t_2$ and stops it at time $t_3$ to be constant. As a result, the output signal at the output terminal of the amplifier includes an integration value of the input signal taken from time $t_1$ to $t_2$ and another integration value of the potential change from time $t_2$ to $t_3$ at said other end of the resistor 8. As described above, in the integration circuit shown in FIG. 1, the potential of the integrated output signal at the output terminal of the amplifier 2 does not have a correct value, $V_{02}$. This is distinguished particularly when an analogue switch formed by a metal oxide semiconductor transistor is used for the switch 10. The inventors of the present application studied the cause of the integrated output signal having an improper value, i.e. why the potential at said other end of the resistor 8 does not instantaneously change to the potential $V_A$ at the same time as the switch 10 is opened but exponentially changes to the potential $V_A$. As a result of this study, it is found that the switch 10 in the integration circuit has a parasitic capacitance 16 and that, when the voltage signal to be integrated is applied to said other terminal of the resistor 8, charges are stored in the parasitic capacitor 16 and, when the switch 10 is opened, the charges are discharged through the resistor 8. That is to say, this fact causes the integrated signal to be improper in value.

The present invention, which is based on this fact, applies a reference voltage to said other end (the point b) of the resistor 8 in the same instance that the switch 10 is opened, thereby to block the flow of the charges stored in the parasitic capacitor 16 through the resistor 8.

SUMMARY OF THE INVENTION

Accordingly, an object of the invention is to provide an integration method capable of providing an integrated output signal with a correct value.

Another object of the invention is to provide an integration method in which a parasitic capacitance has no effect on an integrated output signal.

Still another object of the invention is to provide an integration method capable of sustaining an integrated output signal at a correct value.

An additional object of the invention is to provide an integration circuit providing an integrated output signal with a correct value.

A further object of the invention is to provide an integration circuit in which a parasitic capacitance has no effect on an integrated output signal.

A still further object of the invention is to provide an integration circuit capable of sustaining an integrated output signal at a correct value.

According to one aspect of the invention, there is provided an integration method having a step for applying a reference potential signal to an input part of an integration circuit at the same time as the application of a voltage signal to be integrated to the input part is stopped.

According to another aspect of the invention, there is provided an integration circuit comprising; operational amplifier means with first and second input terminals and an output terminal; capacitor means connected between the first input terminal and the output terminal; resistive means connected at one end to the first input terminal; switch means connected to the other end of said resistive means; a control means for controlling the open and close operations of the switch; a source which is to be connected to said other end of the resistor and for providing a voltage signal to be integrated; a reference voltage signal source connected to the second input terminal; and means which applies, at the same time as the switch means is opened, a signal with the same potential as the signal derived from the reference voltage signal source to said other end of the resistor.

Other objects and features of the invention will be apparent from the following description taken in connection with the accompanying drawings, in which:

BRIEF DESCRIPTION OF THE DRAWINGS

FIG. 1 shows a circuit diagram of a conventional integration circuit;

FIG. 2 shows a set of waveforms of signals at various portions in the circuit in FIG. 1;

FIG. 3 shows a circuit diagram of an embodiment of an integration circuit according to the invention;

FIG. 4 shows a set of waveforms of signals at various portions in the circuit in FIG. 3;

FIG. 5 shows a block diagram of a control voltage signal source used in the circuit shown in FIG. 3;

FIG. 6 shows circuit diagram of another embodiment of an integration circuit according to the invention;

FIG. 7 shows a set of waveforms of signals at various portions in the circuit shown in FIG. 6;

FIG. 8 shows a block diagram of a control voltage signal source used in the circuit shown in FIG. 6.

DETAILED DESCRIPTION OF PREFERRED EMBODIMENTS

Referring now to FIG. 3, there is shown an integration circuit according to the invention. In the figure, reference numeral 22 designates an operational amplifier with a non-inverting terminal 24 and an inverting terminal 26 and an output terminal 28. The non-inverting terminal 24 is connected to a reference voltage signal source 30 for supplying a reference voltage $V_A$ of, for example, zero potential. A capacitor 32 with a capacitance C is connected between the inverting terminal 26 and the output terminal 28. The inverting terminal 26 is further connected to one end of a resistor 34 with a resistance R. The other end of the resistor 34 is connected to a signal source 38 for providing a voltage signal to be integrated having a value Vs, through a first switch 36, and to a reference voltage signal source 30 through a second switch 40. The first and second switches 36 and 40 are each an analogue switch formed by a MOS transistor, for example. The open and close operations of the first and second switches 36 and 40 are controlled by a control signal Vc from a control voltage signal source 42 and another control signal $\overline{V}c$ from an inverter 44, respectively.

Before the description of the open and close operations of the first and second switches 36 and 40, the waveforms of signals at various portions in the integration circuit in FIG. 3 will be described. The waveform shown in FIG. 4A is the one of a signal at a portion a in FIG. 3, i.e. of the control voltage signal Vc to open or close the switch 36 and fed from the control voltage signal source 42. FIG. 4B shows the waveform of a signal at a portion b, i.e. the signal $\overline{V}c$ corresponding to the control voltage signal Vc phase-inverted. FIG. 4*c* shows the waveforms a signal at a point c, i.e. at said other end of the resistor 34. FIG. 4D shows a waveform of an integrated output signal at a point d.

The open and close operations of the switches 36 and 40 will be given with reference to the waveforms mentioned above. The first switch 36, which is controlled by the control voltage signal Vc shown in FIG. 4A, is closed when the signal Vc is at high level, for example, i.e. during the period from $t_1$ to $t_2$. During the close of the first switch 36, the signal Vs from the signal source 38 is applied to said other end (the point c) of the resistor 34. The potential at the inverting terminal of the amplifier 22 when the first switch is open is equal to that at the non-inverting terminal. The open and close operations of the second switch 40 are controlled by the signal as shown in FIG. 4B, i.e. the control voltage signal $\overline{V}c$ corresponding to the control voltage signal Vc phase-inverted by the inverter 44. The second switch 40 is closed when the signal $\overline{V}c$ is at high level, for example. Since the control voltages Vc and $\overline{V}c$ are related in antiphase, the second switch 40 is closed when the first switch 36 is open while it is opened when the first switch 36 is closed.

In FIG. 3, a capacitor 46 as indicated by dotted line which is connected between said other end (portion c) of the resistor 34 and ground indicates a parasitic capacitance of the first and second switches 36 and 40.

Assume now that the voltage Vs to be integrated as shown in FIG. 4C is applied to said other end (point c) of the resistor 34 during the period from $t_1$ to $t_2$. In this case, the signal as shown in FIG. 4D appears at point d, i.e. the output terminal 28 of the amplifier 22. The integrated output signal at time $t_2$ has a value $V_{02}$ of the form $$V_{02} = V_{01} - 1/C \int_{t_1}^{t_2} (Vs - V_A)/R \, dt$$

where $V_{01}$ is the potential at the output terminal (point d) at time $t_1$.

As described above, the second switch 40 is so controlled to be open so long as the signal Vs is applied to said other end (point c) of the resistor 34. As also stated previously, when the first switch is open, the second switch 40 is closed. Under this condition, the impedance of the resistor 34 is usually larger than that of the second switch, when viewed from said other end (portion c) of the resistor 34. Accordingly, the charges stored in the parasitic capacitor 46 when the first switch 36 is closed are instantaneously discharged through the second switch 40 at the same time as the second switch 40 is closed. That is, the potential at said other end (c) of the resistor 34 changes instantaneously from Vs to $V_A$, so that no potential difference is produced across the resistor 34. Accordingly, there is eliminated the discharging of the charges stored in the parasitic capacitor 46 through the resistor 34 as in the conventional integration circuit. Therefore, the potential at said other end (c) of the resistor 34 is not adversely affected by the parasitic capacitor 46. As a result, the potential at d, i.e. the potential of the integrated output signal, is maintained at a proper value $V_{02}$ after $t_2$, as shown in FIG. 4D.

The control voltage signal $\overline{V}c$ shown in FIG. 4B may be replaced by a signal as shown in FIG. 4B', i.e. a voltage signal which rises at the falling edge of the control signal Vc shown in FIG. 1 and thereafter maintains a high level for a given time period. In short, when the first switch 36 is opened, a signal with the same potential as the reference voltage signal $V_A$ is simultaneously applied to said other end (c) of the resistor 34.

The control voltage signal source 42 for producing a signal as shown in FIG. 4A, may be constructed by a circuit shown in FIG. 5, for example. The signal source shown in FIG. 5 is comprised of a clock pulse generator 82, a counter 84 for counting pulses outputted from the generator 82, a flip-flop (F.F.) circuit 86 which is set or reset by the output signal from the counter 84 and an OR circuit 88. The counter 84 is provided with a terminal CL for receiving the clock pulse from the clock pulse generator 82 and reset terminal R for receiving a reset signal through the OR circuit 88. The counter 84 further includes a first terminal Q1 for outputting a first output signal when a given number of pulses are counted and a second terminal Q2 for producing a second output signal when a given number of pulses are thereafter counted. The signal outputted from the terminal Q1 is applied to the set terminal S of the F.F circuit 86, thereby to set the F.F circuit 66. The signal from the terminal Q2 is applied to the reset terminal of the F.F circuit 86 thereby to reset the F.F 86. The output signal from the F.F 86 is outputted as an output signal of the control voltage signal source 42 which in turn is applied to the switch 36 and through the inverter 44 to the switch 40.

In operation, a reset signal coming from exterior is applied to the terminal R of the counter 84 through the OR circuit 88 to reset the counter 84. Following the reset of the counter 84, a given number of pulses from the counter 84 is counted so that the terminal Q1 of the counter 84 outputs a signal which is then inputted to the terminal S of the F.F circuit 86. As a result, the F.F circuit 86 is set so that the level of the output signal is changed from "0" to "1". When a given number of pulses is additionally counted, a signal is outputted from the terminal Q2 of the counter 86, and is inputted to the terminal R of the F.F circuit 86. Accordingly, the F.F circuit is reset so that the output signal of the F.F circuit 86 returns from "1" to "0". The signal from the terminal Q2 of the counter 84 is also applied through the OR circuit 88 to the terminal R of the counter 84. As a result, the counter 84 is reset and its state returns to its original state. If the counter 84 is so designed that the time period from the outputting from the terminal Q1 to the outputting from the terminal Q2 is equal to that from $t_1$ to $t_2$, the F.F circuit 86 produces a signal as shown in FIG. 4A.

Turning to FIG. 6, there is shown another embodiment of an integration circuit according to the invention. In the figure, like portions in FIG. 3 will be designated by like reference numerals and the explanation relating to them will be omitted. This embodiment employs three switches 62, 64 and 66 in place of the first switch 36. These switches 62, 64 and 66 are each connected at one end commonly to the one end of the resistor 34, and at the other end to first, second and third Vs1, Vs2, and Vs3 signal sources 68, 70 and 72, respectively, which provide signals to be integrated each having a value Vs. The open and close operations of the switches 62, 64 and 66 are controlled by the control voltage signals from the first to third (Vc1, Vc2, and Vc3) control voltage signal sources 74, 76 and 78, respectively. The signals from the signal sources 74, 76 and 78 are NORed by a NOR circuit 80. The second switch 40 is controlled by the signal from the NOR circuit 80. FIGS. 7A to 7H illustrate waveforms at the signals at the various portions in the circuit in FIG. 5. The waveforms in FIGS. 7A to 7H correspond to those of the signals at portions a to h in the FIG. 6 circuit, respectively. In the embodiment shown in FIG. 6, three signals are successively integrated.

In operation, the switch 62 is turned on or off under control of the control signal Vc1 from the first control signal source 74, as shown in FIG. 7A. The switch 62 is turned on when the control signal Vc1 is at high level (during the period from $t_1$ to $t_2$), for example. So long as the switch 62 is closed, the signal Vs1 (the potential at the high level side in FIG. 7E) supplied from the signal source 68 is continuously applied to one end (e,f, g) of the resistor 34 closer to the switches 36 and 40.

The switch 64 is turned on or off under control of the control signal Vc2 from the second control voltage source 76 as shown in FIG. 7B. The switch 64 is turned on when the control signal Vc2 is at high level (during the period from $t_3$ to $t_4$), for example. When the switch 64 is closed, the voltage signal Vs2 (the potential at the low level side in FIG. 7F) from the second signal source 70 is continuously applied to the end (e,f,g) of the resistor 34.

The switch 66 is turned on or off under control of the control signal Vc3 from the third control voltage signal source 78, as shown in FIG. 7C. The switch is turned off when the signal is at high level (during the period from $t_5$ to $t_6$), for example. When the switch 66 is closed, the voltage signal Vs3 (the potential at the high level side in FIG. 7G) of the third signal source 72 is continuously applied to the terminal (e,f,g) of the resistor 34. When the switches 62, 64 and 66 are all open, the potential at the inverting terminal 26 of the amplifier 22 is equal to the potential at the non-inverting terminal 24.

The switch 40 is turned on or off by a control signal as shown in FIG. 7D, that is, the output signal Vc4 from the NOR circuit 80 receiving the control voltage signals Vc1, Vc2 and Vc3 from the control voltage signal sources 74, 76 and 78. The switch 40 is turned on when the output signal Vc4 is at high level (during the period from $t_2$ to $t_3$ or $t_4$ to $t_5$, for example), for example. As a result, the reference potential $V_A$ is applied to the terminal (e,f,g) of the resistor 34. As just mentioned, the output signal from the NOR gate 80 controls the opening or closing of the switch 40. Accordingly, the switch 40 is closed when the switches 62, 64 and 66 are all open, while it is open when one of them is closed. Thus, the voltage signal which is a superposition of triangular waves of FIGS. 7E to 7G, is applied to the terminal (e,f,g). In the circuit in FIG. 6, the capacitor 46 (indicated by dotted lines) connected between the terminal (e,f,g) of the resistor 34 and ground indicates a parasitic capacitor of the switches 62, 64, 66 and 40, as in the circuit of FIG. 3.

With the same reason as in the case of FIG. 3, charges stored in the parasitic capacitor 46 do not discharge through the resistor 34, even when the first switch 36 (all of the switches 62, 64 and 66) is opened. Therefore, the potential of the output signal integrated at the output terminal h of the integration circuit is maintained at a proper value. In the waveform of the integrated output voltage signal in FIG. 7H, the period preceding to time $t_1$, from $t_2$ to $t_3$, $t_4$ to $t_5$, and $t_4$ to $t_5$ indicate that the integrated output signal sustains its proper value.

The control voltage signal source 42 for outputting the control voltage signals as shown in FIGS. 7A to 7C may be constructed as shown in FIG. 8. In FIG. 8, like reference numerals are used to designate like portions in FIG. 5, and description thereof will be omitted. A counter 92 has output terminals Q1 to Q6. Three F.F circuits are assembled into the circuit. The first F.F circuit 94 is connected at the set and reset terminals S and R to the terminals Q1 and Q2 of the counter 92, respectively. The second F.F circuit 96 is connected at the set and reset terminals S and R to the terminals Q3 and Q4 of the counter 92, respectively. The third F.F circuit is connected at the set and reset terminals S and R to the terminals Q5 and Q6 of the counter 92, respectively. The first to third F.F circuits 94, 96 and 98 produce output signals to the switches 62, 64 and 66, respectively.

The operation of the just-mentioned circuit will be given with omission of the explanation relating to the portions referred to in the FIG. 5 circuit. The difference of the FIG. 8 circuit from the FIG. 5 circuit resides mainly in that three F.F circuits are used and the counter 92 has six terminals Q1 to Q6. The operation of the counter 92 is substantially the same as that of the counter 92. When counting a given number of pulses, it produces at the terminal Q1 an output pulse. Subsequent to this, when counting a given number of pulses, it produces at the next terminal Q2 an output signal. This operation will be repeated with respect to other remaining terminals Q3 to Q6. The output signals from the terminals Q1 and Q2 are applied to the set and reset terminals S and R of the first F.F circuit 94, respectively. Similarly, the output signals from the terminals Q3 and Q4 are applied to the set terminal S and the reset terminal R of the second F.F circuit 96, respectively. The output signals from the terminals Q5 and Q6 are applied to the set and reset terminals Q5 and Q6 of the third F.F circuit 98, respectively. The output signals from the first to third F.F circuits are applied to the switches 62, 64 and 66, respectively. When receiving the signal from the terminal Q1, the first F.F circuit 94 has "1" level at the output and maintains this level until it receives the signal from the terminal Q2. Similarly, the second F.F circuit 96 maintains "1" from the receiving of the signal of the terminal Q3 till the receiving of the signal of the terminal Q4. Similarly, the third F.F circuit 98 maintains "1" from the receiving of the signal of Q5 till the receiving of the signal of Q6. The signal from the terminal Q6 is also applied to the reset terminal R of the counter 92 through the OR circuit 88.

Thus, when the third F.F circuit 98 is reset, the counter 98 is simultaneously reset to return to its initial state. In this case, the counter 92 forms a logic circuit in which: the period from the outputting of the signal of Q1 to the outputting of the signal of Q2 is equal to that from $t_1$ to $t_2$; the period from the outputting of Q2 to the outputting of Q3 is equal to that from $t_2$ to $t_3$; the period from the outputting of Q3 to the outputting of Q4 is equal to that from $t_3$ to $t_4$; the period from the outputting of Q4 to the outputting of Q5 is equal to that from $t_4$ to $t_5$; the period from the outputting of Q5 to the outputting of Q6 is equal to that from $t_5$ to $t_6$. With such a logic circuitry, the control signals as shown in FIGS. 7A to 7C are applied to the switches 62 to 66, respectively.

The switches 36, 40, 62, 64 and 66 in the integration circuit of FIGS. 3, 5 may be constructed by using unipolar or bipolar transistors. In the circuit of FIG. 3, the signal from the control voltage signal source 42 is applied to the respective gates of the transistors in the switches 36 and 40. Similarly, in the FIG. 6 circuit, the signals from the signal sources 74, 76, 78 are applied to the gates of the respective transistors in the switches 62, 64, 66.

From the foregoing description, it will be seen that the invention successfully eliminates adverse effects of a parasitic capacitor on the output signal of the integration circuit, even when the parasitic capacitance of the switch used is large.

What is claimed is:

1. An integration method using an integration circuit having operational amplifying means with first and second input terminals and an output terminal and receiving at said first input terminal a reference potential signal, capacitor means connected between said second input terminal and said output terminal of said amplifying means, and resistive means having first and second ends, said resistive means connected at said first end to said second input terminal of said amplifying means and said resistive means selectively connected at said second end to a voltage signal to be integrated, comprising a step of directly and non-resistively applying a signal with substantially the same potential as the potential of said reference potential signal to said second end of said resistive means, and at the same time stopping the application of said voltage signal to be integrated to said second end of the resistive means.

2. An integration method using an integration circuit having operational amplifying means with first and second input terminals and an output terminal and receiving at said first input terminal a reference potential signal, capacitor means connected between said second input terminal and said output terminal of said amplifying means, and resistive means having first and second ends, said resistive means connected at said first end to said second input terminal of said amplifying means and said resistive means selectively connected at said second end to any one of a plurality of voltage signals to be integrated, comprising a step of directly and non-resistively applying a signal with substantially the same potential as the potential of said reference potential signal to said second end of said resistive means, and at the same time stopping the application of any one of said plurality of voltage signals to be integrated to said second end of said resistive means.

3. An integration method using an integration circuit having operational amplifying means with first and second input terminals and an output terminal and receiving at said first input terminal a reference potential signal, capacitor means connected between said second input terminal and said output terminal, and resistive means having first and second ends, said resistive means connected at said first end to said second input terminal, comprising a step (A) of applying a voltage signal to be integrated to said second end of said resistive means, while at the same time preventing application of a signal having substantially the same potential as the potential of said reference potential signal to said second end of the resistive means, and a step (B) of stopping the application of said voltage signal to be integrated to said second end of the resistive means, and at the same time directly and non-resistively applying said signal having substantially the same potential as the potential of said reference potential signal to said second end of said resistive means.

4. An integration method according to claim 3, wherein said steps (A) and (B) are repeated.

5. An integration method using an integration circuit having operational amplifying means with first and second input terminals and an output terminal and receiving at said first input terminal a reference potential signal, capacitor means connected between said second input terminal and said output terminal, and resistive means having first and second ends, said resistive means connected at said first end to said second input terminal, comprising a step (A) of applying any one of a plurality of voltage signals to be integrated to said second end of said resistive means, while at the same time preventing application of a signal having substantially the same potential as the potential of said reference potential signal to said second end of said resistive means, and a step (B) of stopping the application of said one voltage signal to be integrated to said second end of said resistive means, and at the same time directly and non-resistively applying said signal having substantially the same potential as the potential of said reference potential signal to said second end of said resistive means.

6. An integration method according to claim 5, wherein said steps (A) and (B) are carried out for each of said plurality of voltage signals to be integrated.

7. An integration circuit comprising operational amplifying means with first and second input terminals and an output terminal and receiving at said first input terminal a reference potential signal, capacitor means connected between said second input terminal and said output terminal of said amplifying means, resistive means having first and second ends, said resistive means connected at said first end to said second input terminal of said amplifying means, a voltage signal source for generating a voltage signal to be integrated; first switch means connected between said second end of said resistive means and said voltage signal source; a control signal source for generating a control signal to control the opening and closing of said first switch means; a reference voltage signal source connected to said first input terminal of the operational amplifying means to generate said reference potential signal; and second switch means connected to said second end of said resistive means to directly and non-resistively apply a signal with substantially the same potential as the potential of said reference potential signal to said second end of said resistive means, when said first switch means is opened to stop the supply of said voltage signal to be integrated from said voltage signal source to said second end of said resistive means.

8. An integration circuit according to claim 7, in which said first switch means is a bipolar transistor.

9. An integration circuit according to claim 7, in which said first switch means is a unipolar transistor.

10. An integration circuit according to claim 7, in which said first switch means comprises: inverter means for inverting the phase of said control signal from said control signal source; and a switch connected between said second end of said resistor and said reference voltage signal source, the opening and closing of said switch being controlled by the output signal from said inverter means.

11. An integration circuit according to claim 10, in which said switch is a bipolar transistor.

12. An integration circuit according to claim 10, in which said switch is a unipolar transistor.

13. An integration circuit comprising operational amplifying means with first and second input terminals and an output terminal and receiving at said first input terminal a reference potential signal, capacitor means connected between said second input terminal and said output terminal of said amplifying means, and resistive means having first and second ends, said resistive means connected at said first end to said second input terminal of said amplifying means, a plurality of voltage signal sources for generating voltage signals to be integrated; a plurality of first switch means connected in parallel between said second end of said resistive means and said voltage signal sources; a plurality of control signal sources each correspondingly provided for said first switch means to control the opening and closing of a corresponding first switch means; a reference voltage signal source connected to said first input terminal of said operational amplifying means to generate said reference potential signal; and second switch means connected to said second end of said resistive means to directly and non-resistively apply a signal with substantially the same potential as the potential of said reference potential signal to said second end of said resistive means when said first switch means are opened to stop the supply of said voltage signals to be integrated to said second end of said resistive means from said voltage signal sources.

14. An integration circuit according to claim 13, in which said first switch means comprise bipolar transistors.

15. An integration circuit according to claim 13, in which said first switch means comprise unipolar transistors.

16. An integration circuit according to claim 13, in which said second switch means comprises: a detecting circuit which detects a non-active state of the control signal from each of said control signal sources to produce an active state signal; and a switch connected between said second end of said resistive means and said reference voltage signal source, opening and closing of said switch being controlled by said active state signal from said detecting circuit.

* * * * *